(12) United States Patent
Okabe et al.

(10) Patent No.: US 7,452,424 B2
(45) Date of Patent: Nov. 18, 2008

(54) VAPORIZER

(75) Inventors: Tsuneyuki Okabe, Kai (JP); Shigeyuki Okura, Kofu (JP)

(73) Assignee: Tokyo Electron Limited, Tokyo (JP)

( * ) Notice: Subject to any disclaimer, the term of this patent is extended or adjusted under 35 U.S.C. 154(b) by 236 days.

(21) Appl. No.: 11/235,287

(22) Filed: Sep. 27, 2005

(65) Prior Publication Data

US 2006/0065254 A1  Mar. 30, 2006

(30) Foreign Application Priority Data

Sep. 30, 2004  (JP) ............................. 2004-287846

(51) Int. Cl.
  *C23C 16/00* (2006.01)
(52) U.S. Cl. .................. 118/726; 392/401; 392/399
(58) Field of Classification Search ............... 118/725, 118/726; 123/577, 25, 25 B; 165/120–130, 165/47; 257/310; 438/778, 691; 392/399, 392/401

See application file for complete search history.

(56) References Cited

U.S. PATENT DOCUMENTS 3,651,789 A * 3/1972 Giardina ..................... 122/32
3,848,572 A * 11/1974 Giardina ..................... 122/32
3,892,205 A * 7/1975 Naitou et al. ................ 122/32
4,252,087 A * 2/1981 Kime ......................... 122/158
4,924,936 A * 5/1990 McKown .................... 165/47
5,451,260 A * 9/1995 Versteeg et al. ............. 118/725
6,461,982 B2 * 10/2002 DeBoer et al. .............. 438/778
6,503,837 B2 * 1/2003 Chiou ........................ 438/691
2002/0195643 A1 * 12/2002 Harada ...................... 257/310

FOREIGN PATENT DOCUMENTS

JP  8-17749  1/1996

* cited by examiner

*Primary Examiner*—Stephen K. Cronin
*Assistant Examiner*—Keith Coleman
(74) *Attorney, Agent, or Firm*—Oblon, Spivak, McClelland, Maier & Neustadt, P.C.

(57) ABSTRACT

A vaporizer for generating a process gas from a gas-liquid mixture fluid includes a container defining a process space of the vaporizer. A supply head having a plurality of spray holes to spray the fluid is disposed within the container. A heating passage is disposed below the spray holes within the container. The heating passage is configured to heat the fluid passing therethrough and thereby generate the process gas. A gas delivery passage is connected to the container to laterally deliver the process gas from below the heating passage. A mist receiver is provided at the container below the gas delivery passage.

20 Claims, 6 Drawing Sheets

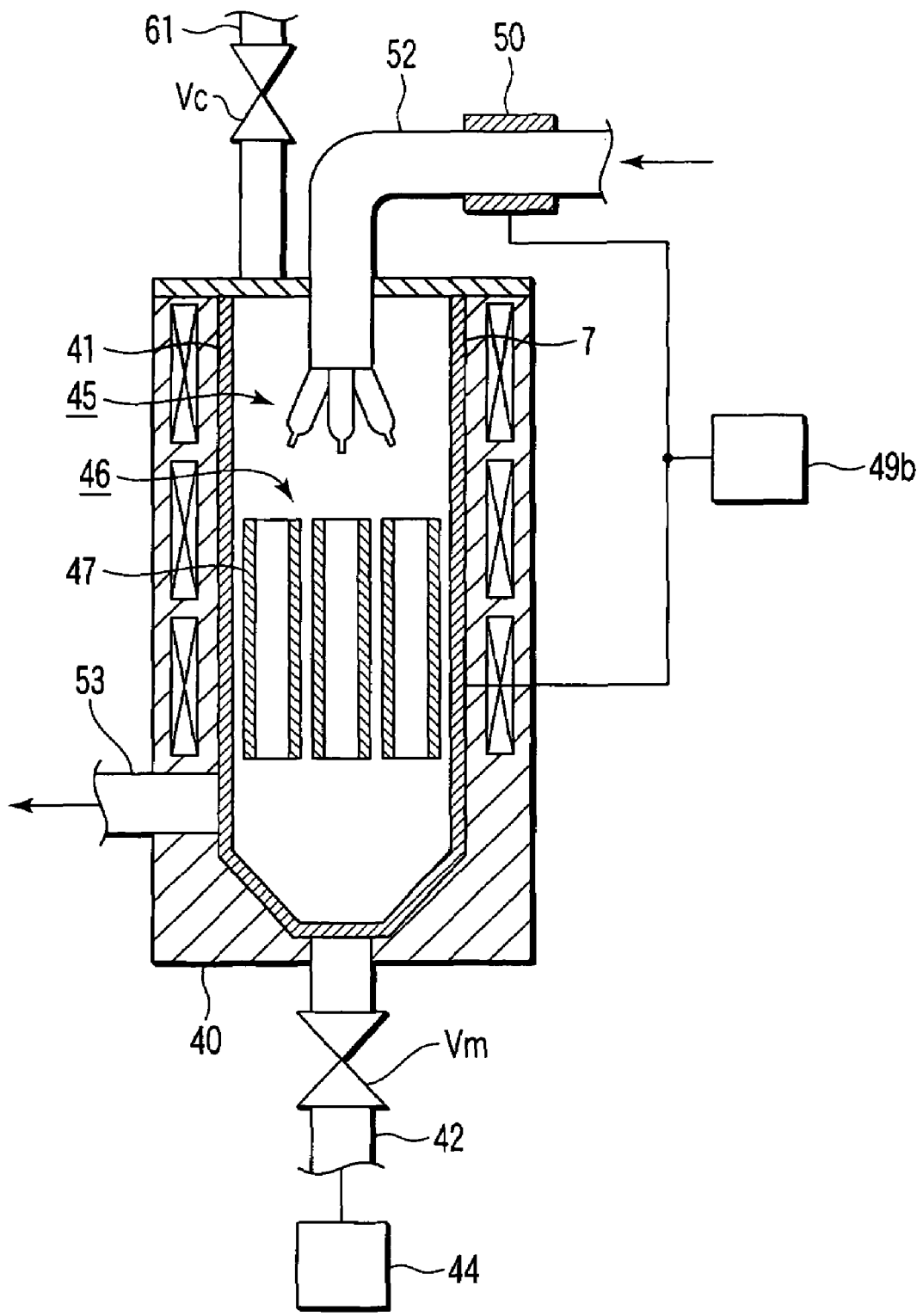
F I G. 6

US 7,452,424 B2

VAPORIZER

CROSS-REFERENCE TO RELATED APPLICATIONS

This application is based upon and claims the benefit of priority from prior Japanese Patent Application No. 2004-287846, filed Sep. 30, 2004, the entire contents of which are incorporated herein by reference.

BACKGROUND OF THE INVENTION

1. Field of the Invention

The present invention relates to a vaporizer for generating a process gas from a gas-liquid mixture fluid, a gas generating apparatus for generating a process gas from a liquid material, and a semiconductor processing system. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

A film formation process for forming a predetermined film on the surface of a semiconductor wafer is performed in manufacturing semiconductor devices. For example, a process of this kind is performed, using a low-pressure CVD (Chemical Vapor Deposition) apparatus. In low-pressure CVD apparatuses, a source material is supplied in a gaseous state to promote a chemical reaction, thereby depositing a thin film on the surface of a wafer. In apparatuses of this kind, there is a case where a process gas is generated by vaporizing a liquid material, and is supplied into a process chamber as a film formation gas.

Examples of a film formation process using a process gas generated by vaporizing a liquid material are as follows. Specifically, a process gas generated by vaporizing TEOS (tetraethoxysilane), and oxygen ($O_2$) gas are used to form an $SiO_2$ film. A process gas generated by vaporizing $Si_2Cl_6$, and ammonia ($NH_3$) gas are used to form a silicon nitride ($Si_3N_4$) film.

There is known a baking type and a VC (Vapor Control) type as systems for vaporizing a liquid material. The baking type is configured to supply a liquid material into a heating vessel and vaporize it by heating. The VC type is a simplification of the baking type, and is configured to vaporize a liquid material by bringing it into direct contact with a vaporizing portion. The baking type is suitable for vaporization of TEOS, which has a vapor pressure of 5.6 kPa (42 Torr) at about 85° C., and HCD ($Si_2Cl_6$), which has a vapor pressure of 14.4 kPa (108 Torr) at about 85° C. The VC type is suitable for vaporization of TEOS, and BTBAS ($SiH_2[NH(C_4H_9)]_2$), which has a vapor pressure of 6.7 kPa (50 Torr) at about 85° C.

BRIEF SUMMARY OF THE INVENTION

An object of the present invention is to provide a vaporizer that can vaporize a liquid material with high efficiency. Another object of the present invention is to provide a gas generating apparatus and a semiconductor processing system that can perform a process with high efficiency.

According to a first aspect of the present invention, there is provided a vaporizer for generating a process gas from a gas-liquid mixture fluid, the vaporizer comprising:
a container defining a process space of the vaporizer;
a supply head having a plurality of spray holes to spray the fluid within the container;
a heating passage disposed below the spray holes within the container, the heating passage being configured to heat the fluid passing therethrough and thereby generate the process gas;
a gas delivery passage connected to the container to laterally deliver the process gas from below the heating passage; and
a mist receiver provided at the container below the gas delivery passage.

According to a second aspect of the present invention, there is provided a gas generating apparatus for generating a process gas from a liquid material, the apparatus comprising:
a pre-treatment unit configured to generate a gas-liquid mixture fluid from the liquid material; and
a vaporizer to which the fluid is supplied from the pre-treatment unit through a fluid supply passage,
wherein the vaporizer comprises
a container defining a process space of the vaporizer,
a supply head connected to the fluid supply passage and having a plurality of spray holes to spray the fluid within the container,
a heating passage disposed below the spray holes within the container, the heating passage being configured to heat the fluid passing therethrough and thereby generate the process gas,
a gas delivery passage connected to the container to laterally deliver the process gas from below the heating passage, and
a mist receiver provided at the container below the gas delivery passage.

According to a third aspect of the present invention, there is provided a semiconductor processing system comprising:
a process chamber configured to accommodate a target substrate;
a support member configured to support the target substrate inside the process chamber;
a heater configured to heat the target substrate inside the process chamber;
an exhaust system configured to exhaust gas inside the process chamber;
a gas supply system configured to supply a process gas into the process chamber, and including a gas generating apparatus for generating the process gas from a liquid material,
wherein the gas generating apparatus comprises
a pre-treatment unit configured to generate a gas-liquid mixture fluid from the liquid material, and
a vaporizer to which the fluid is supplied from the pre-treatment unit through a fluid supply passage,
wherein the vaporizer comprises
a container defining a process space of the vaporizer,
a supply head connected to the fluid supply passage and having a plurality of spray holes to spray the fluid within the container,
a heating passage disposed below the spray holes within the container, the heating passage being configured to heat the fluid passing therethrough and thereby generate the process gas,
a gas delivery passage connected to the container to laterally deliver the process gas from below the heating passage, and a mist receiver provided at the container below the gas delivery passage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 6 is a sectional view showing a vaporizer according to another embodiment of the present invention;

DETAILED DESCRIPTION OF THE INVENTION

In the process of developing the present invention, the inventors studied problems concerning conventional vaporizers and vaporizing systems. As a result, the inventors have arrived at the findings given below.

Vaporizing systems of the baking type and VC type described above are suitable for vaporization of materials, such as TEOS and BTBAS, which have a high vapor pressure and a high gas decomposition temperature. However, these vaporizing systems cannot sufficiently vaporize liquid materials having a low vapor pressure and a low decomposition temperature, and thus cannot generate a process gas at a sufficient flow rate. Examples of a liquid material having a low vapor pressure and a low decomposition temperature are HEAD (hexaethylaminodesilane), which has a vapor pressure of 0.027 kPa (0.2 Torr) at about 85° C., tetrakis(N-ethyl-N-methylamino) hafnium (TEMAH), which has a vapor pressure of 0.11 kPa (0.85 Torr) at about 85° C., and hafnium tetra-t-butoxide (HTB), which has a vapor pressure of 0.55 kPa (4.12 Torr) at about 85° C. The present inventions studied theses liquid materials for practical use.

The baking type is configured to hold a liquid source material in a vessel at a high temperature for a long time period, and thus may denature the material. Accordingly, this type cannot be applied to vaporization of a liquid material having a decomposition temperature lower than the temperature of the heating vessel. Further, the vessel needs to have a large area to attain a high flow rate.

On the other hand, the VC type is configured to keep a liquid source material exposed to a high temperature. Further, since this vaporization relies on the temperature of a small space, the temperature needs to be high in order to ensure a sufficient flow rate. Accordingly, the liquid source material may be denatured.

Figure 8:
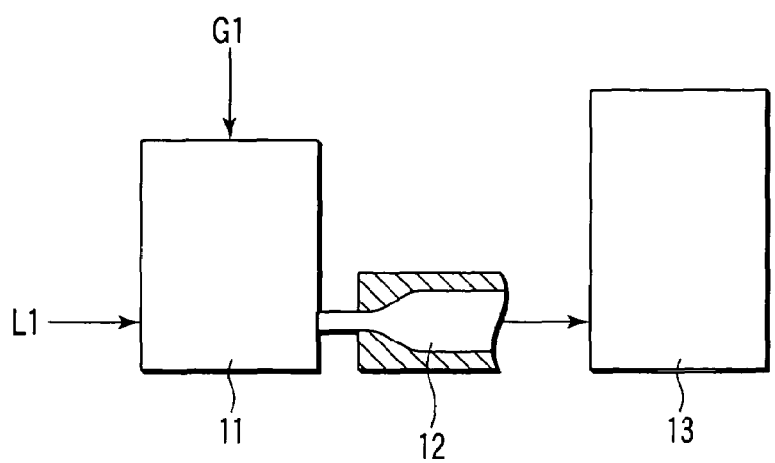
FIG. 8 is a structural view showing a conventional vaporizing system.

Jpn. Pat. Appln. KOKAI Publication No. 8-17749 discloses a vaporizing system utilizing a carrier gas to vaporize a liquid material. FIG. 8 is a structural view showing this conventional vaporizing system. As shown in FIG. 8, this system is configured to supply a liquid material L1 and a carrier gas G1 into a vaporizer 11. The liquid material L1 is caused to collide with the carrier gas G1, such as nitrogen ($N_2$) gas, thereby generating mist. This mist is sprayed from a large outlet 12, and is thereby vaporized by the principle of an atomizer to generate a process gas. Then, this process gas is transferred along with the carrier gas to a low-pressure CVD apparatus 13.

In the case of treating a liquid material having a high vapor pressure, such TEOS, the system shown in FIG. 8 can ensure a sufficient amount of a process gas used for a film formation process. However, in the case of treating a liquid material having a low vapor pressure, such as a hafnium-based material, the system cannot completely vaporize the liquid material, but generates mist, if there is a large amount of the liquid material. In other words, where a liquid material having a low vapor pressure is employed, it is difficult to ensure a large amount of a process gas used for a process in a film formation apparatus of the batch type, although it may be possible to ensure a small amount of a process gas used for a process in a film formation apparatus of the single-substrate type. As a consequence, the process throughput may decrease.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 1:
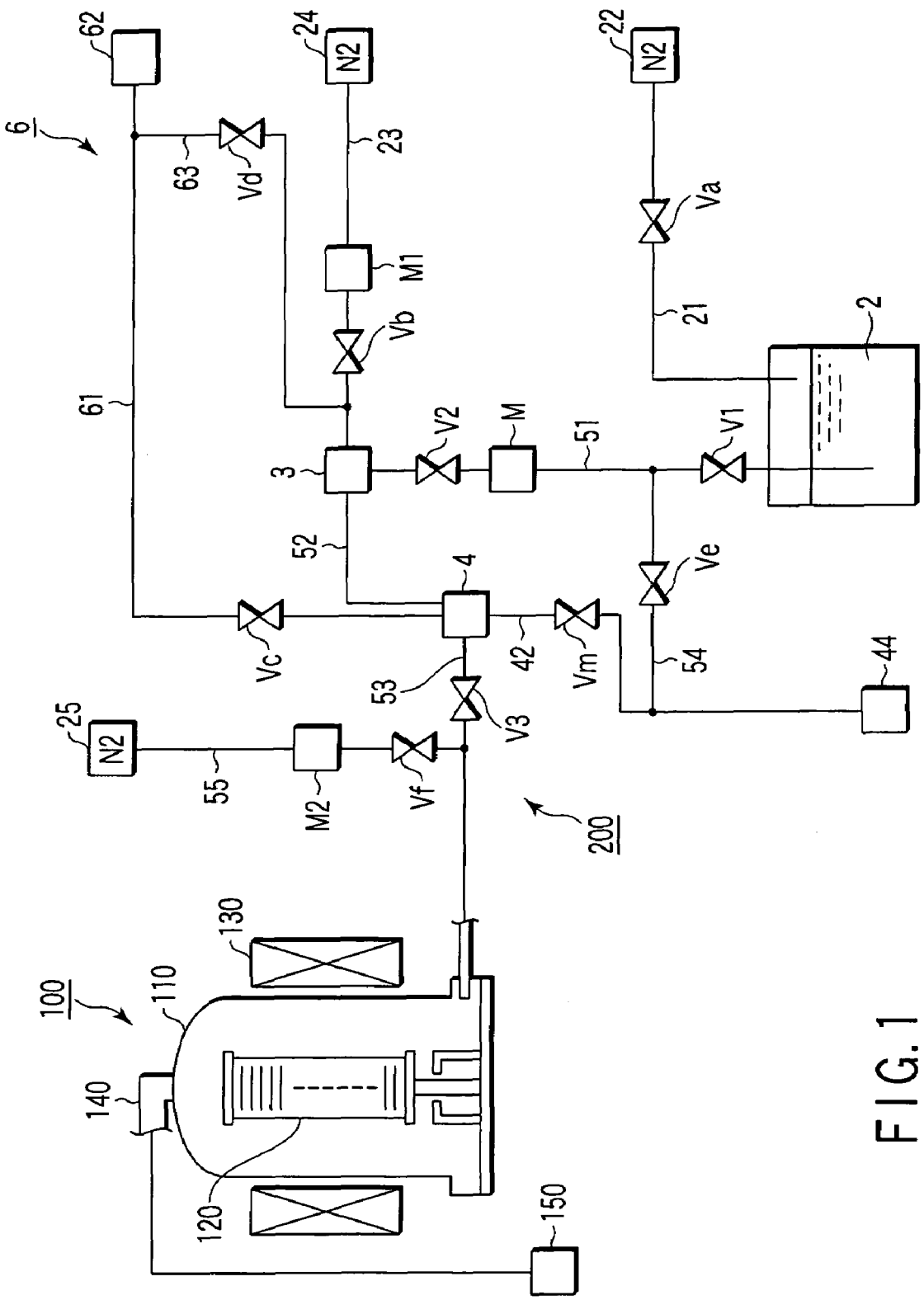
FIG. 1 is a structural view showing a semiconductor processing system (film formation system) according to an embodiment of the present invention.

FIG. 1 is a structural view showing a semiconductor processing system (film formation system) according to an embodiment of the present invention. As shown in FIG. 1, this system includes a film formation section configured to perform a predetermined film formation process on target substrates, such as wafers W, (forming a predetermined thin film on the wafers W). The film formation section 100 is connected to a gas supply system 200 configured to supply a predetermined process gas.

For example, the film formation section 100 comprises a low-pressure CVD apparatus of the batch type having a vertical reaction tube 110 used as a reaction chamber (process chamber). A wafer boat 120 supporting a number of wafers W can be loaded and unloaded into and from the reaction tube 110. A heater 130 is disposed around the reaction tube 110 to heat the wafers W. A vacuum pump 150 used as vacuum exhaust means is disposed to maintain the interior of the reaction tube 110 at a predetermined vacuum level. A predetermined process gas is supplied into the reaction tube 110 through a process gas supply line, as described later.

The gas supply system 200 includes a storage vessel 2, a pre-treatment unit 3, a vaporizer 4, and piping lines connected to them. The storage vessel 2 stores a liquid material having a low vapor pressure of, e.g., 0.55 Pa at 85° C., such as a hafnium-based material, e.g., TEMAH or HTB. The pre-treatment unit 3 is configured to be supplied with the liquid material from the storage vessel 2, and generate a gas-liquid mixture fluid, which is a mixture of vaporized gas derived from the liquid material (gas material) and the liquid material itself. The vaporizer 4 is configured to further vaporize the fluid obtained by the pre-treatment unit 3, so as to generate the process gas.

Specifically, the storage vessel 2 is connected to the pre-treatment unit 3 through a supply line (liquid material supply passage) 51. The end of the supply line 51 at the storage vessel 2 is positioned in the liquid material within the storage vessel 2. The first supply line 51 is provided with a first valve V1, a liquid mass flow meter M, and a second valve V2 in this order from the upstream side (from the storage vessel 2).

A gas supply line 21 provided with a valve Va is connected to the storage vessel 2. One end of the gas supply line 21 is positioned above the surface of the liquid material within the storage vessel 2. The other end of the gas supply line 21 is connected to a supply source 22 of a pressurized gas, such as $N_2$ gas. When the liquid material is supplied from the storage vessel 2 to the pre-treatment unit 3, the storage vessel 2 is supplied with $N_2$ gas by an amount of, e.g., about 1.0 kg/cm². The liquid material is thereby supplied with a pressure, and is transported by the pressure from the storage vessel 2 to the pre-treatment unit 3 at a predetermined flow rate. The pressurized gas may be an inactive gas, such as helium (He) gas or argon (Ar) gas other than $N_2$ gas.

A supply source 24 of a carrier gas, such as $N_2$ gas, is also connected to the pre-treatment unit 3 through a gas supply line 23. The gas supply line 23 is provided with a first mass flow controller M1 and a valve Vb in this order from the carrier gas supply source 24. With this arrangement, the carrier gas or $N_2$ gas can be supplied to the pre-treatment unit 3 at a predetermined flow rate. The carrier gas may be an inactive gas, such as helium (He) gas or argon (Ar) gas other than $N_2$ gas.

Figure 2:
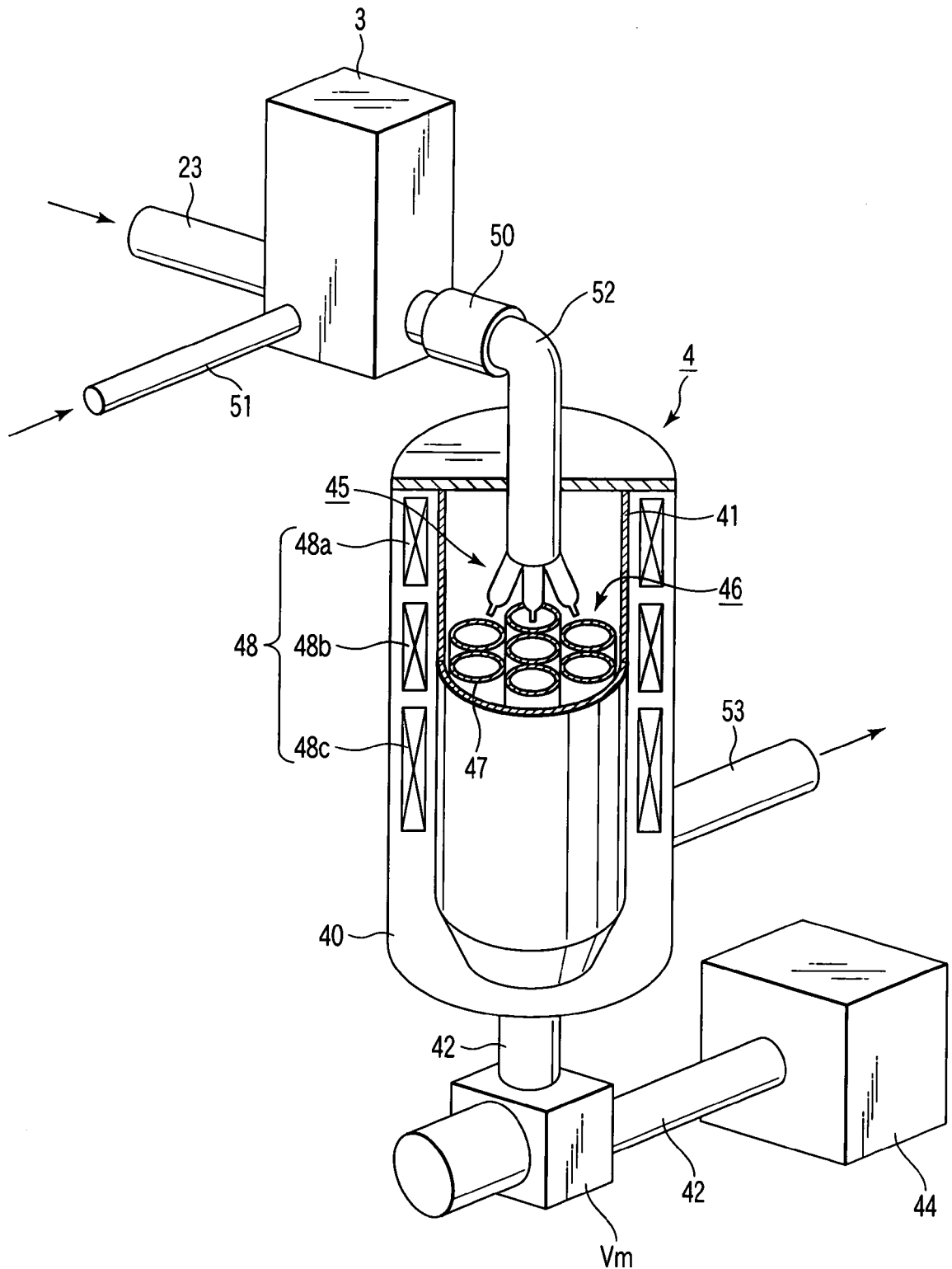
FIG. 2 is a perspective view showing a pre-treatment unit and a vaporizer in FIG. 1.
Figure 3:
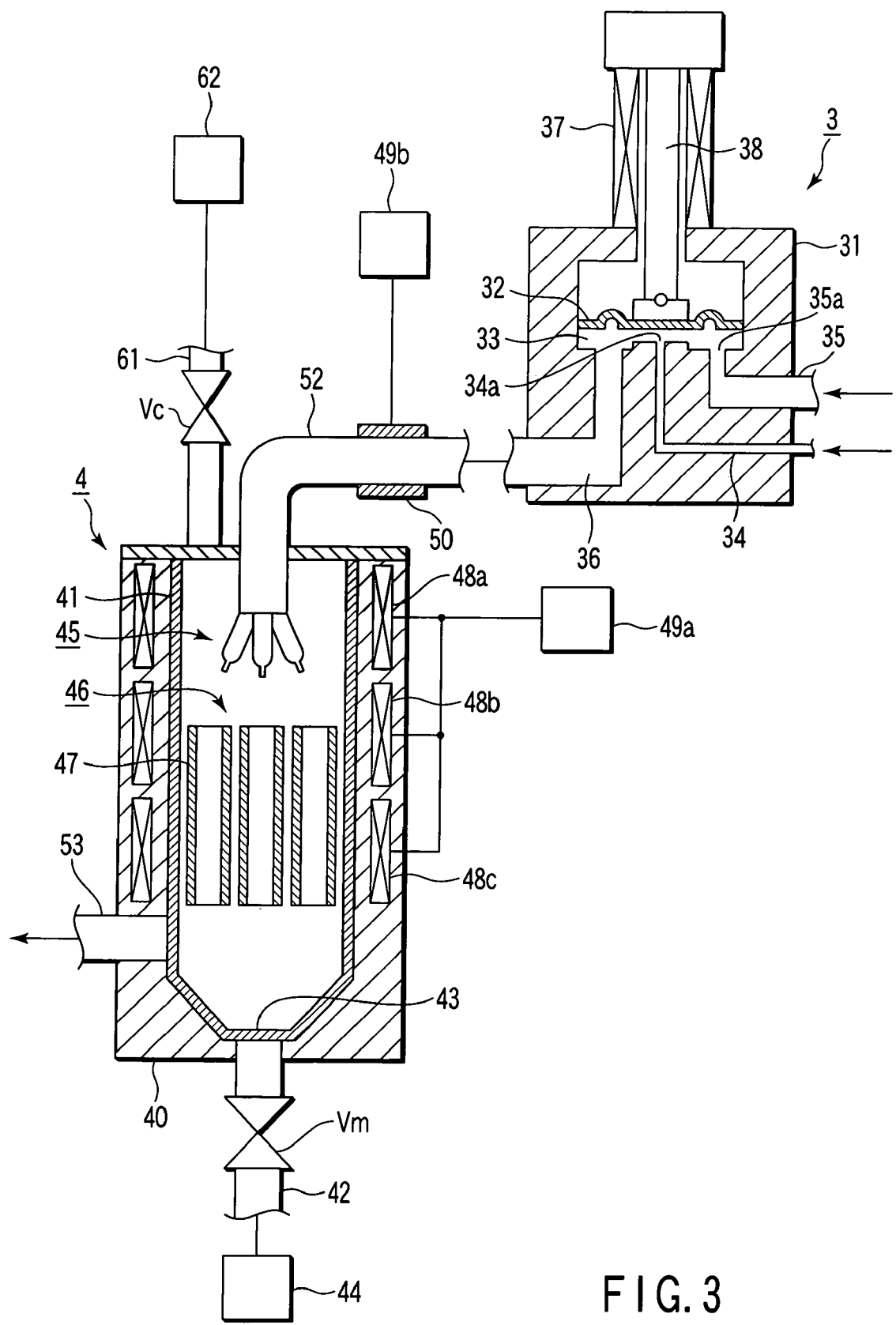
FIG. 3 is a sectional view showing the pre-treatment unit and vaporizer of FIG. 2.

FIG. 2 is a perspective view showing the pre-treatment unit and vaporizer in FIG. 1. FIG. 3 is a sectional view showing the pre-treatment unit and vaporizer of FIG. 2. As also shown in FIGS. 2 and 3, the outlet of the pre-treatment unit 3 is connected to the vaporizer 4 through a second supply line (gas-liquid mixture fluid supply line) 52. The second supply line 52 is provided with a first ultrasonic transducer 50 to apply ultrasonic vibration to the supply line 52. For example, the ultrasonic transducer 50 includes a plurality of rectangular parallelepiped vibrators arrayed in an annular direction around the second supply line 52 such that the inner surface of each vibrator is in contact with the outer surface of the supply line 52. The ultrasonic transducer 50 is supplied with power from a power supply 49b.

As shown in FIG. 3, the pre-treatment unit 3 includes an airtight casing 31 used as a unit body. The interior of the casing 31 is divided into two cells by a valve disc 32, which is formed of a circular metal plate thin enough to be flexible. The lower cell of the casing 31 below the valve disc 32 is arranged as a vaporizing cell 33, which includes a gas feed port (valve port) 34a and a liquid feed port (valve port) 35a.

The gas feed port 34a is connected to the carrier gas supply source 24 through a gas channel 34 formed in the casing 31, and the gas supply line 23. The liquid feed port 35a is connected to the liquid material storage vessel 2 through a liquid channel 35 formed in the casing 31, and the first supply line 51. Thus, the vaporizing cell 33 of the pre-treatment unit 3 can be supplied with the carrier gas and liquid material from the gas feed port 34a and liquid feed port 35a, respectively. Further, a delivery channel 36 is formed in the casing 31 to deliver the gas-liquid mixture fluid from the vaporizing cell 33. The delivery channel 36 is connected to the second supply line 52.

The valve disc 32 is configured to open and close the gas feed port 34a, so as to perform flow rate control. For example, an electromagnetic actuator 37 is disposed to push the valve disc 32 by the tip of its drive shaft 38, so as to control the gas feed port 34a to be opened and closed, and to be open by a certain amount. The entirety of the pre-treatment unit 3 is heated by a heater (not shown) at a predetermined temperature to facilitate vaporization of the liquid material by heating.

According to this pre-treatment unit 3, the interior of the vaporizing cell 33 is set to be a vacuum atmosphere due to vacuum-exhaust at the film formation section (low-pressure CVD apparatus) 100. When the liquid material sent by pressure flows from the liquid feed port 35a into the vaporizing cell 33 having such a vacuum atmosphere, the liquid material is turned into mist and vapor at the same time by adiabatic expansion, i.e., the liquid material is partly vaporized. The pre-treatment unit 3 thereby generates a gas-liquid mixture fluid, which is a mixture of vaporized gas derived from the liquid material (gas material) and the liquid material itself. This gas-liquid mixture fluid is carried by the carrier gas through the delivery channel 36 and second supply line 52 to the subsequent vaporizer 4.

The vaporizer 4 is connected to the reaction tube 110 of the film formation section 100 through a third supply line (process gas supply line) 53 provided with a third valve V3. The vaporizer 4 includes an airtight container 41 used as a unit body for defining a vaporizer process space. The container 41 is formed of a vertical cylinder, which has an inner diameter larger than those of the first and second supply lines 51 and 52, and extends vertically. The second supply line 52 is connected to the top of the container 41, and the third supply line 53 is connected to a position near and above the bottom of the container 41. The third supply line 53 extends from the container 41 in a direction across the vertical direction, such as a horizontal direction in this embodiment.

Consequently, an L-shaped gas route extending first vertically and then horizontally is formed between the second supply line 52 and third supply line 53. A mist receiver is formed at the bottom of the container 41 below the third supply line 53. A discharge line 42 is connected to the bottom of the container 41. A discharge port 43 is formed at the connected portion of the discharge line 42 to the container 41. The discharge line 42 is provided with a valve Vm near the bottom of the container 41. When the valve Vm is closed, the mist receiver near the discharge port 43 can store mist. The other end of the discharge line 42 is connected to an exhaust pump 44 through the discharge line 42, thereby defining a suction passage. FIGS. 1 and 3 show the discharge line 42 as a straight line, while FIG. 2 shows the discharge line 42 as a bent line, but either shape is acceptable in practice, because this difference is only for the sake of drawing practice.

For example, the container 41 of the vaporizer 4 is formed of a stainless steel pipe having an inner diameter of 30 mm and a length of about 250 mm. The third supply line 53 is connected to the container 41 above the bottom thereof, so as not to come into contact with or involve mist stored in the bottom.

Within the container 41, the tip of the second supply line 52 is connected to a supply head 45 having a plurality of, e.g., three, nozzles. The second supply line 52 is located at the center of the container 41, and the nozzles of the supply head 45 are disposed equidistantly and extend downward to gradually separate from the central axis or separate from each other. Accordingly, the spray holes at the tip of the nozzles of the supply head 45 are oriented diagonally downward and outward in different directions at regular intervals. The nozzles of the supply head 45 respectively have orifices to spray the gas-liquid mixture fluid from the spray holes, so that the gas-liquid mixture fluid is supplied in a dispersed state within the container 41.

Within the container 41, a heating passage 46 is disposed below the supply head 45. The heating passage 46 has a honeycombed structure (honeycombed pipe) assembled from a number of metal pipes 47, each formed of stainless steel SUS 316L, and having an inner diameter of 1 mm and a length of about 50 mm. The pipes 47 form a plurality of passage portions respectively defined by heating walls (metal walls) and vertically disposed in parallel with each other. The pipes 47 preferably have polished outer and inner surfaces.

A plurality of, e.g., three heaters 48 (48a, 48b, and 48c) are disposed to surround the container 41 and arrayed in the longitudinal direction of the container 41. The heaters 48 are connected to a power supply. 49a. The heaters 48 heat the interior of the container 41 at, e.g., about 80° C., thereby heating the pipes 47. When the gas-liquid mixture fluid is sprayed from the supply head 45, the fluid is supplied in a dispersed state within the container 41, and flows downward through the passages inside and between the heated pipes. During this period, the gas-liquid mixture fluid is efficiently vaporized by heat exchange, and the process gas is thereby generated.

Further, a supply section 6 for supplying a cleaning solution into the container 41 is connected to the vaporizer 4 to clean up the interior of the container 41 (FIG. 2 does not show the supply section 6 for the sake of convenience). The supply section 6 includes a cleaning solution vessel 62 for storing the cleaning solution, which is connected to the top of the container 41 through a supply line 61 provided with a valve Vc. The cleaning solution is a solvent, such as an alcohol family solution, e.g., ethanol or hexane, which dissolves the liquid material and solidified liquid material. The cleaning solution is supplied from the cleaning solution vessel 62 through the supply line 61 into the container 41. The cleaning solution is discharged through the discharge line 42 when the valve Vm is opened.

The third supply line 53 is provided with a third valve V3 near the vaporizer 4. In order to guide the process gas to the film formation section 100 while preventing it from being re-liquefied, the distance from the third valve V3 to the film formation section 100 is set to be short, such as about 20 cm. In practice, the upstream side of the third supply line 53 from the third valve V3 is very short, such that the third valve V3 is attached to the outlet of the vaporizer 4. Otherwise, the upstream side from the third valve V3 becomes a dead zone, where mist remains. Further, a nitrogen gas supply source 25 is connected to the third supply line 53 downstream from the valve V3, through a supply line 55 provided with a valve Vf and a mass flow controller M2.

The gas supply system 200 may have a branch line 63 provided with a valve Vd, one end of which is connected to the supply line 61, and the other end is connected to the gas supply line 23 between the valve Vb and pre-treatment unit 3. The gas supply system 200 may also have a branch line 54 provided with a valve Ve, one end of which is connected to the first supply line 51 between the first valve V1 and liquid mass flow meter M, and the other end is connected to the discharge line 42 downstream from the valve Vm. For example, each of the pipes of the first, second, and third supply lines 51, 52, and 53, and the discharge line 42 is formed of a ½-inch stainless steel pipe, which has an inner diameter of 10 mm and an outer diameter of 12.7 mm.

Figure 4:
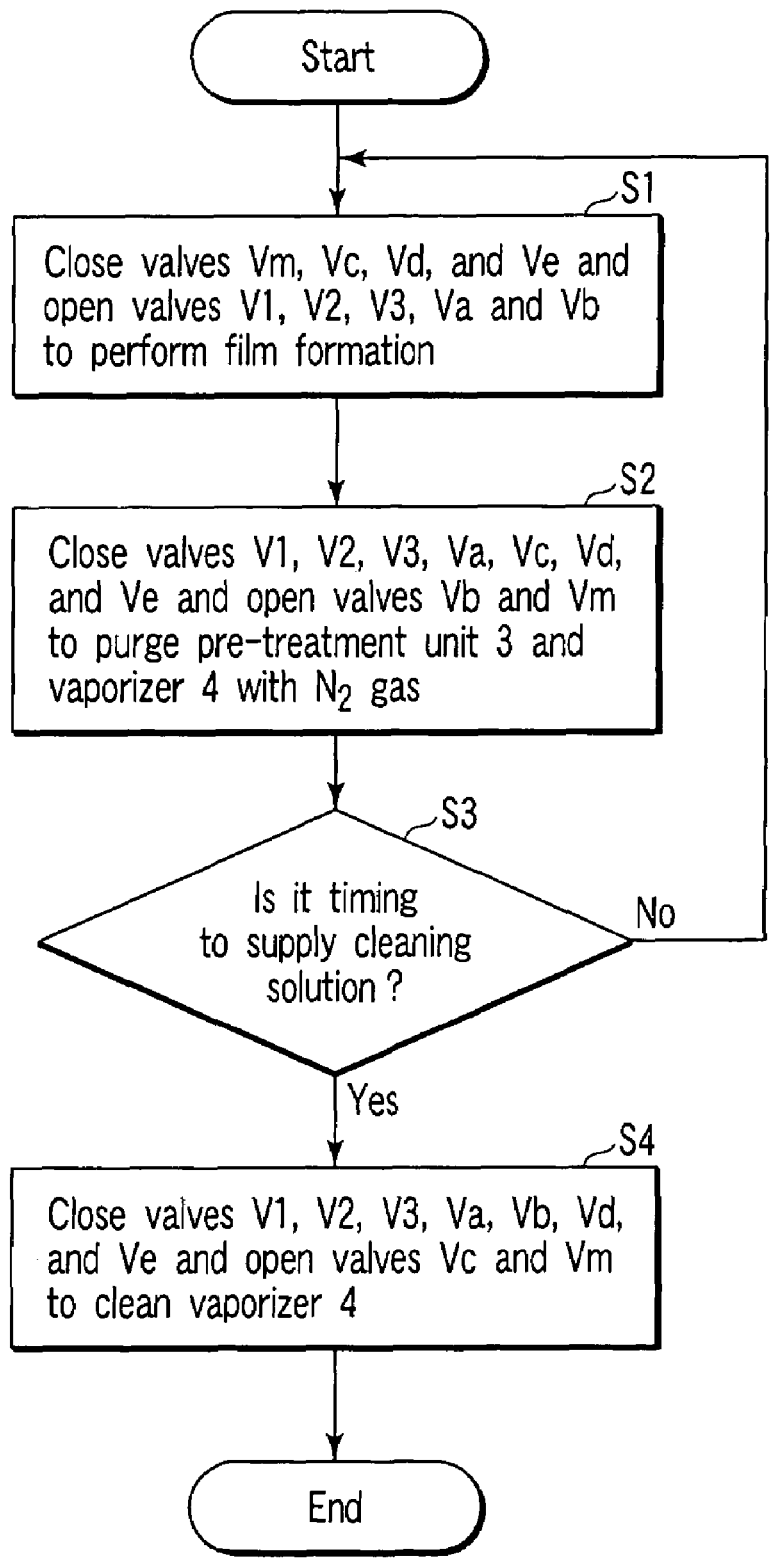
FIG. 4 is a flow chart showing a film formation method according to an embodiment of the present invention.

FIG. 4 is a flow chart showing a film formation method according to an embodiment of the present invention. According to this method, a film formation process (step Si) is first performed while the valves Vm, Vc, Vd, and Ve are set closed, and the valve V1, V2, V3, Va, and Vb are set open. Further, the first ultrasonic transducer 50 is supplied with power.

Specifically, the gas supply system 200 is operated such that $N_2$ gas used as a pressurized gas is supplied into the storage vessel 2 through the gas supply line 21. With this pressurized gas being supplied, the liquid material having a low vapor pressure, such as hafnium-based material, is sent by pressure from the storage vessel 2 through the first supply line 51 to the pre-treatment unit 3, at a flow rate controlled by the liquid mass flow meter M. At this time, the temperature of the liquid material flowing through the first supply line 51 is set at, e.g., about 40° C.

On the other hand, $N_2$ gas used as a carrier gas is supplied from the gas supply line 23 to the pre-treatment unit 3 at a flow rate controlled by the first mass flow controller M1. At this time, since the interior of the reaction tube 110 is vacuum-exhausted at a predetermined vacuum level in the film formation section 100, gases can flow downstream through supply lines in the gas supply system 200 when the corresponding valves are opened. Thus, the pre-treatment unit 3 is supplied with the liquid material and carrier gas at a flow rate ratio of, e.g., the hafnium-based material: $N_2$=5 sccm:600 sccm. Then, as described above, the liquid material is partly vaporized, and the gas-liquid mixture fluid is thereby generated. This gas-liquid mixture fluid is carried by the carrier gas through the second supply line 52 to the vaporizer 4. The second supply line 52 is supplied with ultrasonic vibration by the first ultrasonic transducer 50. As a consequence, when the gas-liquid mixture fluid passes through the line 52, the gas components and liquid components are uniformly mixed.

At the vaporizer 4, the gas-liquid mixture fluid is sprayed from the three nozzles of the supply head 45 in a dispersed state within the container 41. The interior of the container 41 is heated by the heater 49 at, e.g., about 80° C. The gas-liquid mixture fluid from the supply head 45 spreads over the heating passage 46 within the container 41 and flows downward through the passages inside and between the heated pipes 47. During this period, the gas-liquid mixture fluid is heated by heat exchange and vaporized with high efficiency. In this manner, the vaporizer 4 further vaporizes the gas-liquid mixture fluid, thereby generating a mixture of the process gas and mist.

At this time, the container 41 is set in a state where the valve Vm is closed to close the discharge port 43, and thus a gas route bent below the heating passage 46 from a vertical direction to a horizontal direction is formed within the container 41, as described above. The process gas having passed through the heating passage 46 can change direction to the horizontal direction along this bent gas route, and flows into the supply line 53. On the other hand, the mist mixed with the process gas does not change direction, but flows downward due to an inertia force based on its own large weight. Consequently, the mist is separated from the process gas and received by the mist receiver at the bottom of the container 41.

Since the heating passage 46 has a honeycombed structure, the fluid is vaporized with high efficiency, thereby removing most of the mist in the gas material here. The remaining mist flows downward due to an inertia force and is separated from the gas. On the other hand, if the heating passage 46 does not have the honeycombed structure, the mist flows downward due to an inertia force and is separated from the gas.

As described above, the mist in the process gas flows downward within the container 41, and is received by the mist receiver at the bottom of the container 41. The process gas is supplied through the third supply line 53 to the film formation section 100. The temperature of the process gas is set at about 80° C. in the vaporizer 4.

On the other hand, in the film formation section 100, a predetermined number of wafers W are placed on the boat 120, in advance. The boat 120 is loaded into the reaction tube 110 at a predetermined temperature, and the interior of the reaction tube 110 is vacuum-exhausted to a predetermined vacuum level. After the interior of the reaction tube 110 is stabilized at a predetermined temperature and a predetermined pressure, the process gas generated by vaporization, such as a hafnium-based material, and oxygen gas (not shown) are supplied into the reaction tube 110. Under these conditions, a film formation process is performed to form a hafnium oxide film on the wafers W.

After the film formation process is finished, a purge process of the vaporizer 4 is performed (step S2). At this time, the power supply to the first ultrasonic transducer 50 is stopped. Further, the exhaust pump 44 is operated while the valves V1, V2, V3, Va, Vc, Vd, and Ve are set closed, and the valves Vb and Vm are set open. $N_2$ gas used as a purge gas is supplied from the carrier gas supply source 24 through the gas supply line 23 and pre-treatment unit 3 into the vaporizer 4, and then is exhausted from the discharge line 42.

The interior of the pre-treatment unit 3 and vaporizer 4 is thus purged with $N_2$ gas, so that the residual liquid material within the pre-treatment unit 3 and vaporizer 4 is completely removed. As a consequence, the reproducibility of the process is improved, and less particles are generated. This purge process may be performed every time the film formation process is performed at the film formation section 100, or every several times the film formation process is performed, i.e., periodically.

After the film formation process is finished, a purge process of a portion of the third supply line 53 downstream from the third valve V3 may be performed. In this purge process, the valve Vf is opened and the reaction tube 110 is exhausted by the vacuum pump 150. Further, nitrogen gas is supplied from the nitrogen gas supply source 25 through the supply line 55 into the portion of the third supply line 53 downstream from the third valve V3, at a flow rate controlled by the mass flow controller M2. Under these conditions, deposited substances on the inner wall of the third supply line 53, such as residual substances of the process gas and solid components formed by denaturing of the process gas, are pushed away and removed through the film formation section 100. This purge process may be performed every time the film formation process is performed at the film formation section 100, or every several times the film formation process is performed, i.e., periodically.

After the vaporizer 4 is purged with $N_2$ gas, judgment is made as to whether it is time to perform cleaning of the vaporizer 4 with a cleaning solution (step S3). If it is not time to perform this cleaning, this flow returns back to the step S1. If it is time to perform this cleaning, this flow proceeds to a step S4. For example, this cleaning of the vaporizer 4 is periodically performed every predetermined number of times the film formation process is performed at the film formation section 100.

In this cleaning of the vaporizer 4 with a cleaning solution, the exhaust pump 44 is operated while the valves V1, V2, V3, Va, Vb, Vd, and Ve are set closed, and the valves Vc and Vm are set open. Under these conditions, the mist stored in the container 41 is discharged from the container 41 through the discharge line 42, while the cleaning solution is supplied into the vaporizer 4 through the supply line 61. Since the cleaning solution is a solvent that dissolves the liquid material and solidified liquid material, even if mist has been partly re-liquefied or denatured to solid components, they are dissolved by the cleaning solution and removed, while mist deposited on the inner wall of the container 41 of the vaporizer 4 is washed away.

In the cleaning process, the exhaust pump 44 may be operated while the valves V2, Vd, and Ve are set open. Under these conditions, the cleaning solution is caused to flow through the branch line 63, pre-treatment unit 3, liquid mass flow meter M, first supply line 51, branch line 54, and discharge line 42, so as to remove deposited substances on the inner walls of these members, such as the liquid material and solidified components of the liquid material.

According to this vaporizer 4, the gas-liquid mixture fluid is sprayed from a plurality of, e.g., three spray holes of the supply head 45 disposed within the container 41, and the gas-liquid mixture fluid is thereby supplied in a dispersed state. Consequently, the gas-liquid mixture fluid is impartially distributed over the entirety within the container 41. It follows that liquid drops contained in the gas-liquid mixture fluid can be uniformly subjected to heat exchange from the heated container 41, and vaporized with improved efficiency (heat exchange rate).

At this time, while the gas-liquid mixture fluid flows through the supply line 52, the fluid is supplied with energy of micro-vibration or ultrasonic waves by the first ultrasonic transducer 50 disposed on the second supply line 52. Consequently, the gas-liquid mixture fluid or mixture of gas and liquid is microscopically agitated, and is reformed to a uniform state. Since the gas-liquid mixture fluid is supplied into the vaporizer 4 in this state, the fluid is vaporized more readily.

Figure 5:
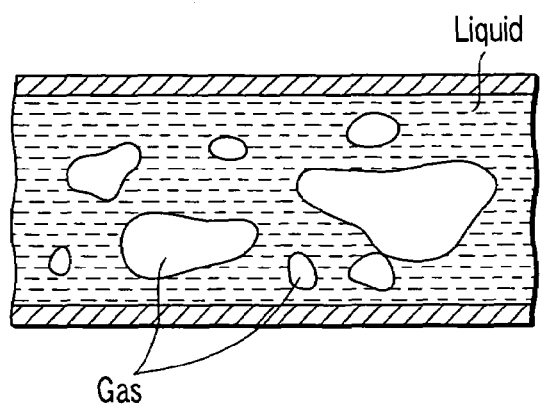
FIG. 5 is a sectional view showing an image of a gas-liquid mixture fluid.

FIG. 5 is a sectional view showing an image of the gas-liquid mixture fluid. As shown in FIG. 5, the gas-liquid mixture fluid is in a state where gas is contained and mixed in liquid. When the fluid is supplied with ultrasonic wave energy, the liquid is dispersed to reduce the size of gas bubbles. Consequently, the gas and liquid in the fluid are uniformly mixed to improve the vaporization efficiency. In contrast, if liquid drops are large, it is difficult to vaporize them, and it is difficult to separate mist from the fluid afterward. Further, when the gas-liquid mixture fluid is supplied with ultrasonic wave energy, liquid drops are partly atomized, which also facilitates the vaporization. The flow rates of the liquid and gas are about 5 cc/min and 600 cc/min, respectively.

The honeycombed structure of the heating passage 46 increases the heat transfer area within the vaporizer 4, and thereby improves the vaporization efficiency. Further, the pipes (passage portions) 47 of the heating passage 46 are straight and thus only have a small pressure loss. Specifically, the heating passage (honeycombed pipe) 46 is formed of a bundle of straight pipes, to which the gas-liquid mixture liquid is uniformly distributed. The gas-liquid mixture fluid flows downward through the passages inside and between the heated pipes 47, during which the fluid is heated and vaporized by heat exchange with the pipes 47. This increases the contact surface between the gas-liquid mixture fluid and heating medium, i.e., the heat transfer area, thereby ensuring high vaporization efficiency. Further, the pressure loss through the pipes is small, thereby preventing the fluid from becoming difficult to vaporize due to pressure increase at the pipes.

The pipes 47 have polished outer and inner surfaces, and thus the purge gas can be easily separated therefrom when it is supplied into the vaporizer 4. In this case, residual substances deposited in the vaporizer 4 are substantially removed, thereby ensuring high purge performance. As described above, the honeycombed pipe 46 can improve characteristics relating to the heat exchange, pressure loss, and gas replacement.

As a comparative example, bent pipes may be adopted to simply increase the heat transfer area. However, in this case, the pressure loss due to the bent pipes increases the pressure inside the pre-treatment unit 3 on the upstream side, thereby making it difficult to vaporize the liquid material. Further, gas stagnation occurs in the bent pipes, and causes liquid drops to be easily deposited inside the pipes. In this case, residual substances deposited in the bent pipes cannot be substantially removed, when the purge gas is supplied into the vaporizer 4.

As described above, the vaporizer 4 can vaporize the liquid material with high efficiency, and separate mist from the process gas. Consequently, even where a liquid material having a low vapor pressure is employed, it is sufficiently vaporized to generate a large amount of process gas containing less mist. In other words, according to the gas supply system 200 employing the vaporizer 4, even where a liquid material having a low vapor pressure is employed, the film formation section 100 can be supplied with a process gas at a high flow rate. Accordingly, although the film formation section 3 is not the single-substrate type, but the batch type that requires a large amount of gas source material, it is possible to ensure a sufficient amount of process gas, thereby increasing the process efficiency.

Furthermore, for example, every time the film formation process is performed, or every predetermined number of times the film formation process is performed, the purge gas is supplied from the gas supply line 23 through the pre-treatment unit 3 and vaporizer 4, so that any liquid material remaining in these portions is removed. Consequently, when the subsequent lot is processed, the interior of these portions is in a dried state with no deposited substances therein, thereby improving the process reproducibility. In this case, the purge gas is supplied into the pre-treatment unit 3 and vaporizer 4 through a supply route different from that for the film formation section 100. The areas to be purged are thus limited only to the pre-treatment unit 3 and vaporizer 4, so that these portions are efficiently purged to completely remove deposited substances therein in a short time period. Further, the space of the third supply line 53 between the valve V3 and film formation section 100 is se to be small, so that deposited substances in this space can be efficiently discharged by exhausting the film formation section 100 by the vacuum pump 150.

Furthermore, after mist is removed from the vaporizer 4 by suction at predetermined timing, cleaning inside the vaporizer 4 is performed. Thus, after mist is discharged, mist and denatured mist sticking inside the container 41 and near the mist receiver is further removed. Consequently, when the subsequent lot is processed, the interior of the vaporizer 4 has no deposited substances therein, thereby preventing particles from being generated and improving the process reproducibility.

FIG. 6 is a sectional view showing a vaporizer according to another embodiment of the present invention. In this embodiment, a second ultrasonic transducer 7 is disposed around a container 41 to apply ultrasonic vibration to the gas or fluid flowing through the container 41. For example, the second ultrasonic transducer 7 includes a plurality of rectangular parallelepiped vibrators arrayed in an annular direction around the container 41 such that the inner surface of each vibrator is in contact with the outer surface of the container 41. Each of the vibrators may be modified to have a curve inner surface that conforms to the outer surface of the container 41 to be in close contact therewith. The second ultrasonic transducer 7 is supplied with power from a power supply 49b to apply ultrasonic vibration to the container 41, for example, when the vaporizer 4 is supplied with a purge gas or cleaning solution.

When the purge gas is supplied to perform purging, the ultrasonic vibration applied to the vaporizer 4 promotes gas separation, thereby improving the purging performance. Specifically, where the container 41 is supplied with ultrasonic wave energy, substances adsorbed on the inner surface of the container 41 are urged to be desorbed therefrom by ultrasonic vibration. The desorbed substances are carried away by the purge gas, thereby attaining an improved purging characteristic. Further, when the cleaning solution is supplied to perform cleaning inside the container 41, the ultrasonic vibration is also applied to the container 41 from the second ultrasonic transducer 7. In this case, substances deposited inside the container 41 are urged to be separated by ultrasonic vibration, thereby attaining high cleaning efficiency.

Figure 7A:
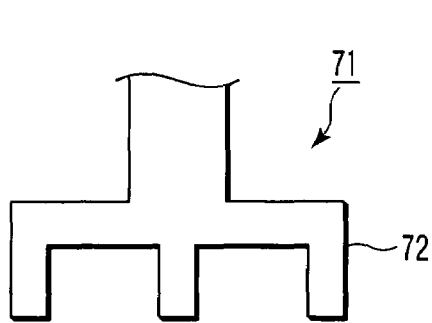
FIGS. 7A and 7B are a side view and a bottom view respectively showing different modifications of a vaporizer supply head.
Figure 7B:
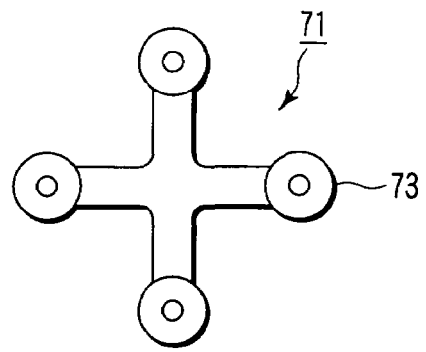

In the embodiments described above, the supply head may include two, or four or more spray holes. As long as the spray holes of the supply head are directed downward, they may be oriented diagonally downward or vertically downward, or oriented in the same direction. FIG. 7A is a side view showing a modification of a vaporizer supply head. The supply head 71 shown in FIG. 7A has spray holes oriented vertically downward, i.e., oriented in the same direction. In this case, the supply head 71 includes a plurality of, e.g., three nozzles 72 extending downward in the same direction. This spray head may be arranged such that any one of the three nozzles 72 extends diagonally downward. FIG. 7B is a bottom view showing another modification of a vaporizer supply head. The supply head shown in FIG. 7B includes four branched nozzles 73.

In the present invention, the liquid material having a low vapor pressure may be $Ta(OC_2H_5)_5$, which has a vapor pressure of 40 Pa or less at 140° C., or TDEAH ($HF[N(C_2H_5)]_4$), which has a vapor pressure of 40 Pa or less at 120° C., other than a hafnium-based material or HEAD. The present invention may be applied to a process of using a process gas generated by vaporizing $Ta(OC_2H_5)_5$ along with $O_3$ gas to form a $Ta_2O_5$ film, other than a process of using a process gas generated by vaporizing HEAD along with $NH_3$ gas to form a silicon nitride film. The film formation section may employ a film formation apparatus of the single-substrate type other than a low-pressure CVD apparatus of the batch type.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor processing system comprising:
   a process chamber configured to accommodate a target substrate;
   a support member configured to support the target substrate inside the process chamber;
   a heater configured to heat the target substrate inside the process chamber;

an exhaust system configured to exhaust gas inside the process chamber;

a gas supply system configured to supply a process gas into the process chamber, and including a gas generating apparatus disposed outside the process chamber for generating the process gas from a liquid material, wherein the gas generating apparatus comprises:

a pre-treatment unit configured to generate a gas-liquid mixture fluid from the liquid material, and a vaporizer to which the fluid is supplied from the pre-treatment unit through a fluid supply passage, wherein the vaporizer comprises:

a container defining a process space of the vaporizer, a supply head connected to the fluid supply passage and having a plurality of spray holes to spray the fluid within the container, a heating passage disposed below the spray holes within the container and comprising a plurality of passage portions disposed in parallel with each other and respectively defined by heating walls, the heating passage being configured to heat the fluid passing therethrough downward and thereby generate the process gas, a gas delivery passage connected to the container to laterally deliver the process gas from below the heating passage, an electric heater configured to heat the process space and the heating walls; and a mist receiver provided at the container below the gas delivery passage.

2. The system according to claim 1, further comprising a mechanism configured to apply ultrasonic vibration to the fluid supply passage.

3. The system according to claim 1, wherein the pre-treatment unit is configured such that the liquid material is supplied into a low-pressure space to vaporize part of the liquid material by adiabatic expansion and thereby generate the fluid.

4. The system according to claim 1, wherein the spray holes are oriented diagonally downward and outward in different directions.

5. The system according to claim 1, wherein the mist receiver is disposed at a bottom inside the container, to which a discharge pump is connected.

6. The system according to claim 1, further comprising a mechanism configured to apply ultrasonic vibration to the container.

7. The system according to claim 1, further comprising a storage vessel for storing the liquid material, connected to the pre-treatment unit through a liquid material supply passage, and a gas supply unit configured to supply a pressurized gas to the storage vessel, so as to send the liquid material by pressure from the storage vessel to the pre-treatment unit through the liquid material supply passage.

8. The system according to claim 3, further comprising a gas supply unit configured to supply a carrier gas to the pre-treatment unit, wherein the fluid is supplied along with the carrier gas from the pre-treatment unit to the fluid vaporizer.

9. The system according to claim 1, wherein the gas supply system is configured to supply, as the process gas, a gas for forming a thin film on the target substrate by CVD.

10. The system according to claim 1, wherein the heating walls are made of metal.

11. The system according to claim 10, wherein the electric heater is disposed around the container of the vaporizer and configured to heat the heating walls by heating the process space of the vaporizer.

12. A semiconductor processing system comprising:

a process chamber configured to accommodate a target substrate;

a support member configured to support the target substrate inside the process chamber;

a heater configured to heat the target substrate inside the process chamber;

an exhaust system configured to exhaust gas inside the process chamber;

a gas supply system configured to supply a process gas into the process chamber, and including a gas generating apparatus disposed outside the process chamber, for generating the process gas from a liquid material, wherein the gas generating apparatus comprises:

a pretreatment unit configured to generate a gas-liquid mixture fluid from the liquid material such that the liquid material is supplied into a low-pressure space to vaporize part of the liquid material by adiabatic expansion and thereby generate the fluid, a storage vessel that stores the liquid material and is connected to the pre treatment unit through a liquid material supply passage, a gas supply unit configured to supply a pressurized gas to the storage vessel, so as to send the liquid material by pressure from the storage vessel to the pretreatment unit through the liquid material supply passage, a vaporizer to which the fluid is supplied from the pre-treatment unit through a fluid supply passage, and a gas supply unit configured to supply a carrier gas to the pre-treatment unit, wherein the fluid is supplied along with the carrier gas from the pre-treatment unit to the fluid vaporizer, wherein the vaporizer comprises:

a container defining a process space of the vaporizer, a supply head connected to the fluid supply passage and having a plurality of spray holes to spray the fluid within the container, a heating passage disposed below the spray holes within the container and comprising a plurality of passage portions disposed in parallel with each other and respectively defined by heating walls, the heating passage being configured to heat the fluid passing therethrough downward and thereby generate the process gas, a gas delivery passage connected to the container to laterally deliver the process gas from below the heating passage, an electric heater configured to heat the process space and the heating walls; and a mist receiver provided at the container below the gas delivery passage.

13. The system according to claim 12, wherein the gas supply system is configured to supply, as the process gas, a gas for forming a thin film on the target substrate by CVD.

14. The system according to claim 13, wherein the liquid material stored in the storage vessel is selected from the group consisting of tetrakis(N-ethyl-methylamino) hafnium, hafnium tetra-t-butoxide, hexaethylaminodesilane, $Ta(OC_2H_5)_5$, and $HF[N(C_2H_5)]_4$.

15. The system according to claim 12, further comprising a mechanism configured to apply ultrasonic vibration to the fluid supply passage.

16. The system according to claim 12, wherein the spray holes are oriented diagonally downward and outward in different directions.

17. The system according to claim 12, wherein the mist receiver is disposed at a bottom inside the container, to which a discharge pump is connected.

18. The system according to claim 12, further comprising a mechanism configured to apply ultrasonic vibration to the container.

19. The system according to claim 12, wherein the heating walls are made of metal.

20. The system according to claim 19, wherein the electric heater is disposed around the container of the vaporizer and configured to heat the heating walls by heating the process space of the vaporizer.

* * * * *